United States Patent [19]

Kometani

[11] Patent Number: 5,306,654

[45] Date of Patent: Apr. 26, 1994

[54] METHOD FOR MANUFACTURING INSULATED GATE FIELD EFFECT TRANSISTOR

[75] Inventor: Nobuyuki Kometani, Tokyo, Japan

[73] Assignee: NEC Corporation, Japan

[21] Appl. No.: 7,251

[22] Filed: Jan. 21, 1993

[30] Foreign Application Priority Data

May 7, 1992 [JP] Japan .................................. 4-114395

[51] Int. Cl.⁵ .......................................... H01L 21/336
[52] U.S. Cl. .................................... 437/41; 437/44; 148/DIG. 126; 257/346
[58] Field of Search .................... 437/41, 44; 148/DIG. 126; 257/346, 382, 461

[56] References Cited

U.S. PATENT DOCUMENTS

| | | | |
|---|---|---|---|
| 4,757,032 | 7/1988 | Contiero | 437/162 |
| 4,974,059 | 11/1990 | Kinzer | 357/23.4 |
| 5,084,401 | 1/1992 | Hagino | 437/31 |
| 5,124,272 | 6/1992 | Saito et al. | 437/41 |
| 5,171,705 | 12/1992 | Choy | 437/41 |

FOREIGN PATENT DOCUMENTS 63-229141 9/1988 Japan .

OTHER PUBLICATIONS

Extended Abstracts (The 38th Spring Meeting, 1991); No. 2, p. 582 and translation thereof (The Japan Society of Applied Physics and Related Societies).

Primary Examiner—George Fourson
Assistant Examiner—David Mason
Attorney, Agent, or Firm—Laff, Whitesel, Conte, Saret

[57] ABSTRACT

An insulated gate field effect transistor having a stable threshold voltage controlled with a good accuracy and a method for manufacturing the same is disclosed. The method for manufacturing a field effect transistor is such that doping a gate electrode with a P-type dopant is carried out after introducing an N-type dopant to a base layer for forming a contact region. The field effect transistor has sources having an extended portion extending into an upper portion of the contact region.

6 Claims, 2 Drawing Sheets

FIG. IA
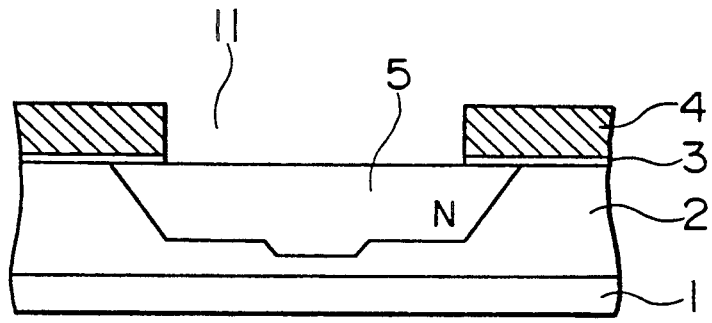
FIG. IB
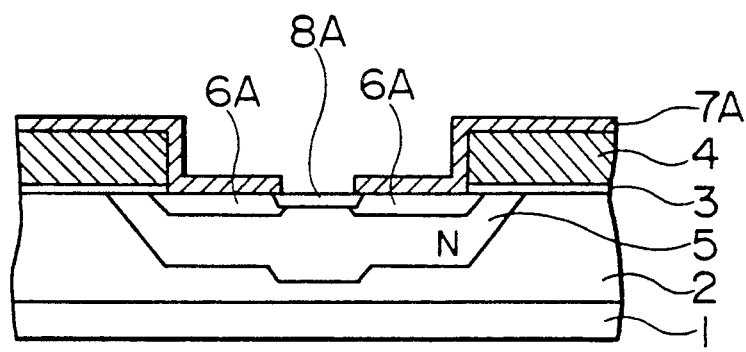
FIG. IC
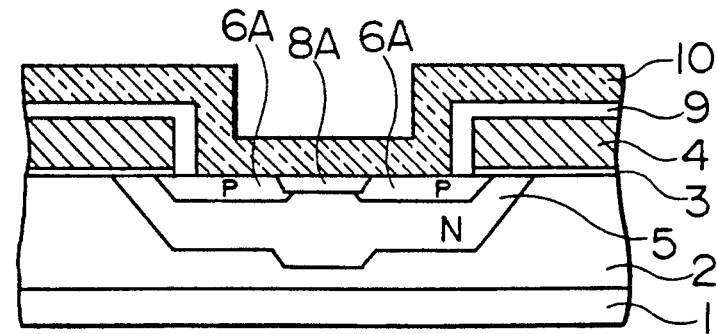

METHOD FOR MANUFACTURING INSULATED GATE FIELD EFFECT TRANSISTOR

BACKGROUND OF THE INVENTION (a) Field of the Invention

The present invention relates to an insulated gate field effect transistor (referred to as an IGFET hereinafter) and a method for manufacturing the same, and more particularly, to an IGFET and a method for manufacturing the same in which a polycrystalline silicon layer serving as a gate electrode is formed of a P-type layer.

(b) Description of the Related Art

An IGFET has a variety of applications in many circuits including power circuits. A conventional method for manufacturing an IGFET will be first described with reference to the drawings. FIGS. 1(A) to 1(C) each shows a step in a conventional process for manufacturing an IGFET of a vertical structure as an example. A gate oxide film 3 and a polycrystalline silicon layer 4 serving as a gate electrode are consecutively formed on a P-type epitaxial layer 2 grown on a P-type silicon substrate 1, an opening 11 being formed in the the gate oxide film 3 and the polycrystalline silicon layer 4 by a photolithographic technology. An N-type base layer 5 is formed by doping a portion of the P-type epitaxial layer 2 with N-type impurities through the opening 11 (FIG. 1A).

Next, a resist layer not shown in the drawings is formed and selectively etched for exposing portions of the base layer 5. P-type source regions 6A are formed on the N-type base layer 5 as shown in FIG. 1B by ion-implanting using the resist layer as a mask. Then, an N-type (n+) contact region 8A for contacting the base layer 5 with an aluminium electrode to be deposited is formed between both the source regions 6A by an ion-implanting by use of a photo-resist layer 7A as a mask. After the photoresist layer 7A is removed, an interlayer insulation film 9 and an aluminium electrode 10 are consecutively formed as shown in FIG. 1C.

The IGFET as shown in FIGS. 1A to 1C has a drawback in which the threshold voltage of the IGFET is not controlled to a desired value, so that the the reliability of the IGFET in an operation is not sufficient.

SUMMARY OF THE INVENTION

An object of the present invention is to provide an IGFET and a method for manufacturing the same in which the threshold voltage of the IGFET is controlled to a desired value with an accuracy so that an IGFET of a high reliability in an operation can be obtained.

According to a first aspect of the present invention, there is provided a method for manufacturing an insulated gate field effect transistor including steps of forming a gate oxide film and a gate electrode of a polycrystalline silicon layer, patterning the gate insulation film and gate electrode for forming an opening therein, doping the gate electrode with a P-type dopant, forming an N-type base layer adjacent to the opening, introducing a dopant to a portion of the base layer for forming a P-type source region, introducing an N-type dopant to another portion of the base layer for forming a N-type contact region adjacent to the source region, the improvement is such that the doping of the gate electrode is carried out after the introducing of the N-type dopant to said another portion of the base layer for forming said N-type contact region.

According to a second aspect of the present invention, there is provided an insulated gate field effect transistor comprising a substrate, an N-type base layer carried by the substrate, a gate insulation film formed on the base layer, a gate electrode formed on the gate insulation film and formed of polycrystalline silicon layer doped with a P-type dopant, a P-type source region formed on the base layer by doping a portion of the base layer, an N-type contact region formed on the base layer adjacent to the source region by doping another portion of the base layer, wherein the source region has an extended "portion extending into an upper end portion of the contact region.

With an insulated gate field effect transistor of the present invention and fabricated by the method of the present invention, only a little amount of the dopant of the gate electrode penetrates during the fabrication step through the gate insulation film into the channel region, the channel region being formed within the base layer during operation. Hence, the IGFET has a stable threshold voltage controlled to a desired value with a good accuracy, so that a high reliability of the insulated gate field effect transistor can be obtained.

BRIEF DESCRIPTION OF THE DRAWINGS

Other and further objects, features and advantages of the present invention will be more apparent from the following description, referring to the accompanying drawings in which:

FIGS. 1A to 1C are cross-sectional schematic views of an IGFET, each for showing a step in a conventional method for manufacturing the IGFET.

DESCRIPTION OF THE PREFERRED EMBODIMENTS

Before description of the configuration of the embodiments according to the present invention, the cause for the problem relating to the threshold voltage of an IGFET fabricated by the conventional method will be first described for the sake of understanding of the present invention.

In FIG. 1B showing the conventional method for manufacturing a vertical MOS FET, when the gate electrode 4 is desired to be formed as an N-type layer, the treatment for forming the N-type layer of the gate electrode 4 is carried out before forming the N-.type base layer 5, while, when the gate electrode 4 is desired to be formed as a P-type layer, the treatment for forming the P-type layer of the gate electrode 4 is carried out together with forming the P-type source regions 6A.

The contact region 8A formed as an N-type (n+) layer usually tends to exhibit a poor characteristics in contact with an aluminium electrode when, for example, phosphorus is introduced as a dopant to the contact region. Hence, the N-type contact region 8A requires a sufficient dopant concentration and a large area for attaining a good contact with aluminium, so that it is formed after forming the source regions 6A, in order to avoid the undesirable dopant passing into the contact region 8A behind the mask during the doping treatment of the source regions 6A and thereby turning a portion of the contact region adjacent to the source regions 6A from an N-type to a P-type region.

It is found that, when a polycrystalline silicon layer 4 serving as a gate electrode is formed as a P-type layer, the threshold voltage is not controlled with an accuracy to a desired value. Such an inaccurate control causes a problem in which an IGFET of a high reliability can not be obtained. The problem is solved by the present invention substantially without accompanying any deficiency or introducing any additional step, as described in more detail hereinafter.

Figure 2A:
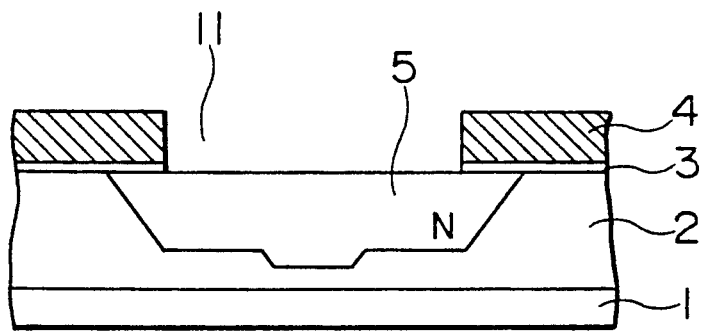
FIGS. 2A to 2C are cross-sectional schematic views of an IGFET, each f or showing a step in a method according to an embodiment of the present invention for manufacturing the IGFET according to another embodiment of the present invention.
Figure 2B:
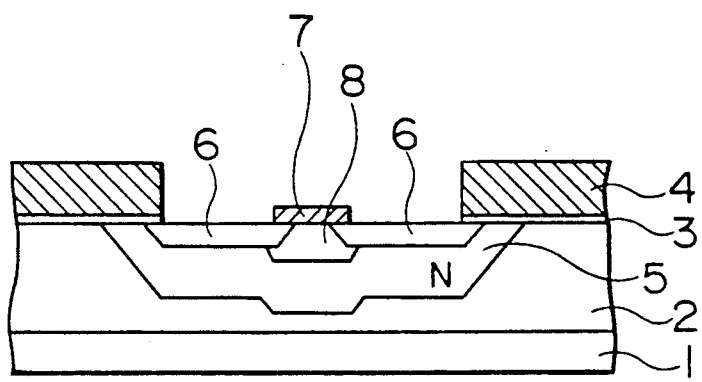
Figure 2C:
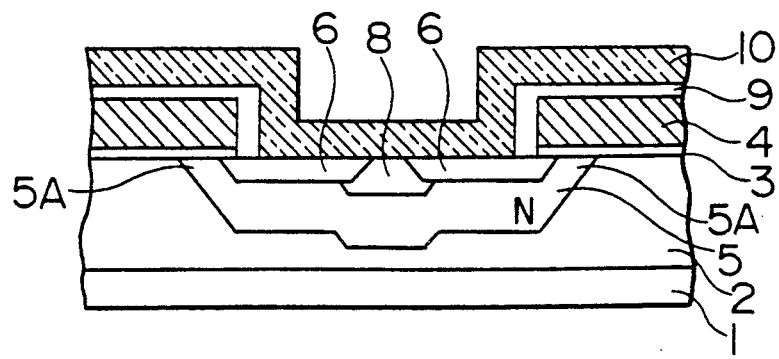

FIGS. 2A to 2C each shows a cross-section of an IGFET of a vertical type called a vertical MOS FET during a fabrication step of a method according to an embodiment of the present invention. In these drawings, the reference numerals designating the elements similar to the elements of FIGS. 1A to 1C are the same as or similar to those in FIGS. 1A to 1C.

In FIG. 2A, a P-type epitaxial layer 2 is grown on a P-type silicon substrate 1, and a thin gate oxide film 3 and a polycrystalline silicon layer 4 serving as a gate electrode are consecutively formed on the P-type epitaxial layer 2. In the gate oxide film 3 and the gate electrode 4, an opening 11 is formed by photolithography. An N-type base layer 5 is formed by introducing a dopant with a $5 \times 10^{13} - 5 \times 10^{14}$ atoms/cm$^2$ dosage using the gate electrode 4 as a mask.

Then, a resist layer not shown in the drawing is formed and patterned for forming a contact region 8. The contact region 8 is formed by ion-implanting phosphorus with about a $5 \times 10^{15}$ atoms/cm$^2$ dosage and by a subsequent driving-in or activation of the dopant at a temperature of about 1000° C. for about 30 minutes. After forming the N-type contact region 8, a photoresist layer 7 is formed on the N-type contact region 8.

Next, P-type source regions 6 are formed by ion-implanting boron as a dopant using the photoresist layer 7 as a mask and by a subsequent activation of the dopant for about 90 minutes at a temperature below about 950° C. During the same step sequence of the ion-implanting and the activation, the polycrystalline silicon layer 4 is also doped with the same dopant as the source regions 6 and formed into a P-type layer for reducing the resistivity of the polycrystalline layer 4.

After the photoresist layer 7 is removed, an interlayer insulation film 9 and an aluminium source electrode 10 are consecutively deposited as shown in FIG. 2C, the source electrode being in contact with the contact region 8 for maintaining the base layer 5 at the same potential as the source regions 6 during the OFF state of the IGFET in operation.

In a vertical MOS FET of FIG. 2C according to an embodiment of the present invention formed by the method as described above, the threshold voltage proved to be stable and controlled with an accuracy to a desired value. This is because the dopant boron introduced to the polycrystalline silicon layer 4 penetrates in a very little amount through the gate oxide film 3 into the channel regions 5A which are formed immediately below the gate oxide film 3 during operation of the IGFET and constitutes upper end regions of the N-type base layer 5. In a vertical MOS FET fabricated by the conventional method, the unstable threshold voltage is found to be the result of penetration of the dopant of the gate electrode to the channel regions during the activation of the dopant within the contact region 8.

The thermal treatment at about 1000° C. for activating the dopant within the contact region 8 in the conventional method resulted in an undesirable penetration of the dopant boron of the polycrystalline layer 4 through the oxide film 3 into the channel regions 5A. The penetrating dopant functions for raising the threshold voltage of the vertical MOS FET. In contrast, with the method of the embodiment according to the present invention, the thermal treatment of the contact region 8 at the temperature of 1000° C. is carried out before the gate electrode 4 is doped with boron, and a thermal treatment below about 950° C., for example at about 900° C., is carried out after the gate electrode is doped with the dopant. The dopant boron in the gate electrode penetrates in a very little amount into the channel region of the N-type base layer during the thermal treatment below about 950° C.

The difference in temperature between about 1000° C. and below 950° C. proved to be critical for the penetration of the dopant of the gate electrode 4 to the channel region through the gate oxide film 3. Hence, a vertical MOS FET fabricated by the embodiment of the present invention has a stable threshold voltage controlled with a good accuracy to a desired value.

With an IGFET fabricated by the embodiment of the present invention, the area of the contact region 8 for the N-type base layer 5 is reduced by the P-type dopant passing into the contact region 8 during forming the P-type source regions 6 after forming the N-type contact region 8. Hence, the source regions 6 each has an extended portion extending into the upper portion of the contact region 8, as shown in FIGS. 2B and 2C. A suitable area for the contact region can be designed in consideration of such reduction in the area by a later doping of the source regions.

The threshold voltage of vertical MOS FETs fabricated by a conventional method ranges, for example, from 1.8V to −1.4V so that the channel region turns from an N-type to a P-type region in some cases, while vertical MOS FETs fabricated by the method of the embodiment had a stable threshold voltage ranging from −2.1 to −3.1V, hence turning of the channel region from an N-type to a P-type region was not found.

A method for fabricating an IGFET according to a second embodiment of the present invention is such that forming the contact region 8 on a portion of the N-type base layer 5 shown in FIG. 2B is carried out by a single diffusion process. In the diffusion process of the second embodiment, a gas such as PCl$_3$ gas is utilized at a temperature of 1000° C. for forming the contact region 8, and the diffusion is carried out, for example, for about thirty minutes. With this method of the second embodiment, the process is simplified over the first embodiment, since only one step is sufficient for forming the contact region 8 as compared to the two steps of ion-implanting and activating the dopant in the first embodiment.

As described above, with the IGFET according to the embodiment of the present invention and fabricated by the method according to the embodiment of the present invention, since activation of the contact region requiring a high temperature treatment is carried out before the gate electrode is doped with boron, subsequent thermal treatment can be carried out at a lower temperature without degrading the characteristics of the IGFET, so that an IGFET of a good characteristics can be obtained.

Since above embodiments are described only for examples, the present invention is not limited to such embodiments and it will be obvious for those skilled in the art that various modifications or alterations can be easily made based on the above embodiments under the scope of the present invention.

What is claimed is:

1. In a method for manufacturing ark insulated gate field effect transistor on a semiconductor substrate, said method including steps of forming a gate insulation film and a gate electrode of a polycrystalline silicon layer, patterning said gate insulation film and gate electrode for forming an opening therein, doping said gate electrode with a P-type dopant, forming an N-type base layer adjacent to said opening, introducing a P-type dopant to a portion of said base layer for forming a P-type source region, introducing an N-type dopant to another portion of said base layer for forming an N-type contact region adjacent to said source region, the improvement wherein said doping of said gate electrode is carried out after said introducing of said N-type dopant for forming the contact region.

2. The method for manufacturing an insulated gate field effect transistor as defined in claim 1 wherein said doping said gate electrode and said introducing P-type dopant for forming said source region are carried out in a common step.

3. The method for manufacturing an insulated gate field effect transistor as defined in claim 2 wherein said common step includes activating said P-type dopant at a temperature below about 950° C.

4. The method for manufacturing an insulated gate field effect transistor as defined in claim 1 wherein said doping N-type dopant is carried out by a single diffusing step at a temperature about 1000° C.

5. The method for manufacturing an insulated gate field effect transistor as defined in claim 4 wherein said doping N-type dopant is carried out under an atmosphere of $PCl_3$ gas.

6. The method for manufacturing an insulated gate field effect transistor as defined in claim 1 wherein said insulated gate field effect transistor is a vertical MOS FET.

* * * * *